United States Patent [19]
Bethke et al.

[11] Patent Number: 5,821,181
[45] Date of Patent: *Oct. 13, 1998

[54] CERAMIC COMPOSITION

[75] Inventors: Shelly J. Bethke; Ross A. Miesem, both of Albuquerque, N. Mex.; Wayne W. Chiou, Fort Lauderdale, Fla.; Rickey G. Pastor, Albuquerque, N. Mex.

[73] Assignee: Motorola Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 630,108

[22] Filed: Apr. 8, 1996

[51] Int. Cl.⁶ ............................. C03C 10/06; C03C 14/00
[52] U.S. Cl. ........................... 501/8; 501/9; 501/32; 501/69; 501/77
[58] Field of Search .................... 501/5, 32, 61, 501/62, 65, 66, 8, 9, 73, 69

[56] References Cited

U.S. PATENT DOCUMENTS

| | | | |
|---|---|---|---|
| 3,673,092 | 6/1972 | Dietz | 501/32 |
| 3,970,465 | 7/1976 | Houbon | 501/61 |
| 4,438,211 | 3/1984 | Mennemann et al. | 501/61 |
| 4,562,161 | 12/1985 | Mennemann et al. | 501/61 |
| 4,593,006 | 6/1986 | Takabatake et al. | 501/32 |
| 4,614,725 | 9/1986 | Ando et al. | 501/136 |
| 4,643,985 | 2/1987 | Ando et al. | 501/136 |
| 4,654,095 | 3/1987 | Steinberg | 156/89 |
| 4,749,665 | 6/1988 | Yano et al. | 501/15 |
| 4,752,531 | 6/1988 | Steinberg | 428/426 |
| 4,777,092 | 10/1988 | Kawakami et al. | 501/32 |
| 4,853,349 | 8/1989 | Martin | 501/8 |
| 4,939,106 | 7/1990 | Miyakoshi | 501/32 |
| 4,948,759 | 8/1990 | Nair | 501/8 |
| 4,961,998 | 10/1990 | Senkalski et al. | 501/61 |
| 4,973,564 | 11/1990 | Chyung et al. | 501/8 |
| 5,089,172 | 2/1992 | Allison et al. | 501/59 |
| 5,338,710 | 8/1994 | Ishigame et al. | 501/17 |
| 5,431,955 | 7/1995 | Kawamura et al. | 501/32 |
| 5,498,580 | 3/1996 | Yamade et al. | 501/9 |
| 5,506,058 | 4/1996 | Ikunino et al. | 428/426 |

FOREIGN PATENT DOCUMENTS

| | | |
|---|---|---|
| 46701 | 3/1984 | Japan . |
| 46702 | 3/1984 | Japan . |
| 46703 | 3/1984 | Japan . |
| 54106 | 3/1984 | Japan . |
| 103075 | 6/1985 | Japan . |

*Primary Examiner*—Karl Group
*Attorney, Agent, or Firm*—Gary J. Cunningham; Colin M. Raufer

[57] ABSTRACT

Multiphase ceramic materials for use in multilayered device fabrication may be fabricated by providing novel glassy precursor materials of a preferred composition, with operable amounts of a non-glassy filler materials. The combined materials are fired at appropriate temperatures, so that a non-glassy anorthite type phase is formed. Material so fabricated is formed in a self-limiting process, in that reaction between the glassy precursor material and the non-glass filler material is terminated when one constituent of the glassy precursor material is fully consumed. The materials of the instant invention, fabricated according to the method disclosed herein, demonstrate excellent dielectric constant, and electrical loss characteristics.

5 Claims, 3 Drawing Sheets

CERAMIC COMPOSITION

TECHNICAL FIELD

This invention relates in general to ceramic materials and methods of making the same, and more particularly, to ceramic materials having a low dielectric constant, a high Q (small loss tangent) values, and an adjustable coefficient of resonance frequency.

BACKGROUND OF THE INVENTION

Conventional multilayer materials for use in, for example, substrates for circuit boards, have traditionally consisted of alumina substrates having tungsten and molybdenum conductors, and fired at approximately 1600° C. in a hydrogen atmosphere. Indeed, it is commonplace for such substrates to be fabricated from ceramics such as alumina, forsterite, steatite, cordierite, mullite, and the like. However, due to the very high temperatures necessary to sinter such substrates, it is often necessary to use high melting temperature metals, such as molybdenum and tungsten. Unfortunately, both molybdenum and tungsten have poor electrical conductivity properties which make them less satisfactory for high speed, complex radio frequency ("RF") circuitry. Moreover, in order to achieve adequate densification of materials such as alumina, sintering times of 48 hours or more at high temperature are required.

The current trend in ceramic materials is toward lower cost material processing, a choice of dielectric constants in those materials, low firing temperatures, adjustable/low coefficient of resonant frequency, and low loss. There are several materials properties of interest for use in multilayer RF devices. Low loss, i.e., a high Q material is a property which helps the overall performance of the device. An electrical Q value greater than 500 is desirable. A coefficient of resonant frequency ($T_f$) at or near 0 or alternatively an adjustable $T_f$ is a characteristic which is an important feature for RF filter design and can determine how much the resonant frequency of a filter made using said material shifts with a change in temperature. Accordingly, a $T_f$ goal of less than ±10 parts per million per ° C. is required for many filter applications. A low firing temperature is also important, as it allows for cofiring silver metallization and hence provides a higher metal Q and a less expensive final device with enhanced RF properties. The typical cofiring temperature for silver metallization is less than 950° C. These requirements when combined with a dielectric constant between 6 and 12, yield a material which is ideal for many RF device applications.

A further limitation of the prior art is that such materials cannot be made using a self limiting chemical reaction to produce a high Q ceramic. The combinations of features described above have heretofore been unavailable in any multilayer materials system. This is due to the fact that the use of a self limiting chemical reaction has not been used to make multilayer ceramic substrates. In contrast, prior art has used essentially non-interacting materials to achieve ceramic materials used in multilayer applications. Examples of such materials can be found in, for example, U.S. Pat. No. 4,939,106 to Miekosa, et al, U.S. Pat. No. 4,654,095 to Steinberg, and U.S. Pat. No. 4,752,531 also to Steinberg.

Accordingly, there exists a need to provide a multilayer ceramic material and methods of making those materials and/or multilayer substrates that demonstrates the characteristics necessary for economical use in RF device applications while avoiding the limitations inherent in the prior art. Moreover, the ceramic material must be easily and repeatably fabricated, and amenable to manufacturing methods that produce materials with consistent electrical and mechanical properties.

DETAILED DESCRIPTION OF THE PREFERRED EMBODIMENT

DETAILED DESCRIPTION OF THE PREFERRED EMBODIMENT

Figure 1:
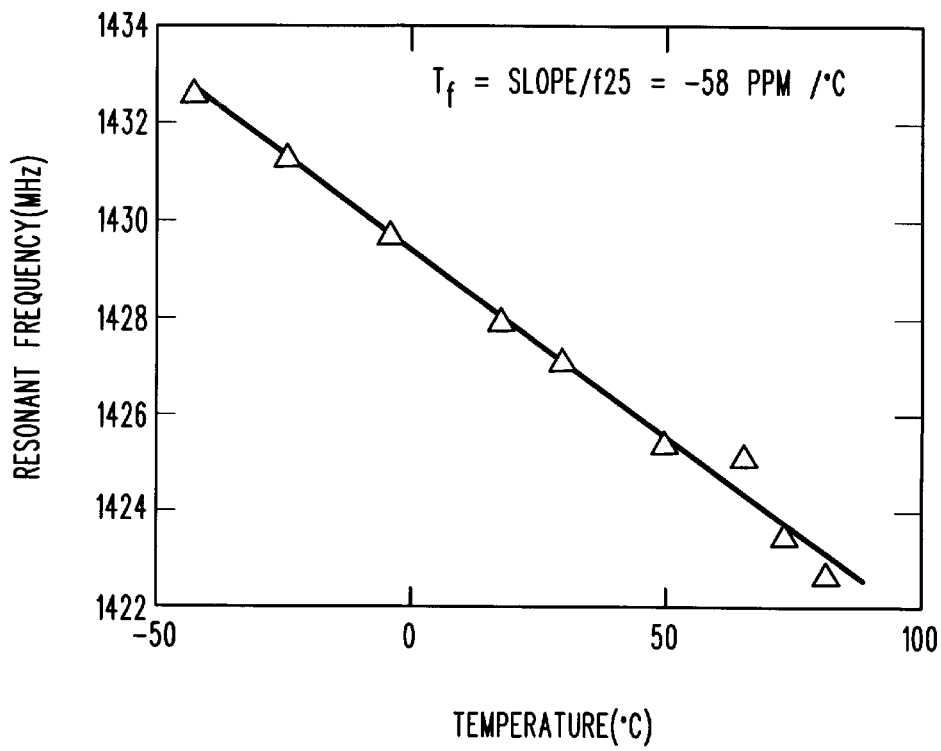
FIG. 1 is a graph plotting resonant frequency vs. temperature in order to calculate $T_f$ for a material in accordance with this invention.

While the specification concludes with claims defining the features of the invention that are regarded as novel, it is believed that the invention will be better understood from a consideration of the following description in conjunction with the drawing figures, in which like reference numerals are carried forward.

The novel multiphased ceramic compositions disclosed herein are composite ceramic bodies the green body of which comprises an engineered glassy precursor material and a more crystalline filler material. The filler material typically comprises alumina, zirconia, and a modifier material used to adjust the $T_f$ of the sintered ceramic body. The $T_f$ modifier material is chosen from the group consisting of $TiO_2$, $CaTiO_3$, or $SrTiO_3$ and combinations thereof. The term engineered glass precursor material refers to the fact that the components thereof are specifically chosen to accomplish three things: First, to provide a high solubility for the fillers; second, to react with the filler to form an anorthite type phase; and third, to provide stress relief between the resulting ceramic and a cofired silver metal during cooling. This stress relief means that the ceramic and metal can be cofired without warppage of the substrate. The filler, i.e., alumina, reacts with the engineered glassy precursor material on firing to form a multiphase ceramic body including at least one anorthite type phase, i.e., $MO.Al_2O_3.2SiO_2$ where M is one or more alkaline earth metals. The ratio of the glass to the filler materials in the green ceramic is in the range of between 30 and 70 wt % and preferably in the range of 40–60 wt %. The amount of the glass added to the green body and the composition of the glass is tailored to give a self limiting chemical reaction as will be described in greater detail below.

To understand the self limiting chemical reaction, it is important to describe its nature. In any chemical reaction, two or more reactants combine to form one or more products. The chemical reaction is said to be self limiting if one of the reactants is used up during the chemical reaction. Herein, $SiO_2$, MO, and $Al_2O_3$ are the reactants and $MO.Al_2O_3.2SiO_2$ is the product. Therefore, the system is a self limiting chemical reaction if either $SiO_2$ or MO or $Al_2O_3$ is consumed in the reaction.

The basic idea surrounding the chemical reaction is that the amount of low Q material is reduced as the higher Q anorthite type material is formed. At the same time that the glass is being consumed, the volume percent of a high Q $Al_2O_3$ is being diminished. The goal of the above chemical reaction is to retain as much $Al_2O_3$ as possible while reducing the glass content as much as possible. Therefore, $Al_2O_3$ is preferably not used as the self-limiting reactant.

The glassy precursor material is designed so that it controls the amount of the crystalline anorthite type phase that will be formed. When the alkaline earth elements or the $SiO_2$ are consumed in the formation of the anorthite type phase, the reaction stops. The final glass body has as its constituents a new glass depleted of $SiO_2$ and MO, a new anorthite type phase, alumina, and any other filler material that was added to the green body. This is an advantageous feature of the instant invention, in that process control is dependent upon the amount of alkaline earth metals present, and not dependent upon the time and temperature of the sintering process. Thus, the processing window is neither narrow nor difficult to control; rather, it is dependent upon the starting materials themselves.

The benefit of the glass-alumina reaction is that it reduces the volume fraction of the low Q glass, and increases the volume fraction of high Q crystalline phases. This means that the final ceramic body has a higher Q than would be present in a glass ceramic composite in which the glass and ceramic did not react. Furthermore, the glass remaining in the ceramic body after the glass-alumina reaction has gone to completion relieves stresses between the final ceramic body and the metallization during cooling. This stress relief is partially responsible for the cofirability of the ceramic body with the metallization. The glassy precursor is responsible for the low fire nature of this system.

The glass in the ceramic composite consists of oxides of silicon, boron, one or more alkaline earth metal oxides, and one or more alkali metal oxides. The silicon and boron are called glass formers in that they are responsible for the formation of a glass. The alkaline and alkali metal oxides are called glass modifiers in that they modify the local structure of the glass and, thereby, lower the softening point of the glass. The preferred weight proportions of each of these materials are as set forth in the following table.

TABLE I

| Material | Broad Range | Preferred Range |
| --- | --- | --- |
| Silicon Dioxide ($SiO_2$) | 35–67 wt % | 48–52 wt % |
| Boron Oxide ($B_2O_3$) | 10–25 wt % | 12.5–17 wt % |
| Lead Oxide (PbO) | 0–25 wt % | 10–20 wt % |
| Alkali Metal Oxides | 2–25 wt % | 2–10 wt % |
| Alkaline Earth Metal Oxides | 5–35 wt % | 20–35 wt % |

When the content of silicon dioxide ($SiO_2$) is too low, there is not sufficient silicon oxide left after crystallization to form a silicate type glass. The glass is thereafter composed mostly of boron which like $SiO_2$ is a glass former. The final glass is a borate glass, characterized by lower Q values, as opposed to a silicate glass. In contrast, when the content of silicon dioxide ($SiO_2$) is too high, the softening point of the initial glass becomes too high for successful sintering below 1000° C. Accordingly, the temperature is too high for cofiring with typical metallization materials such as silver, copper, and gold. When the content of boron oxide is too low, the softening point of the glass also increases.

The alkaline earth metal oxide constituent in the glassy precursor material may be a combination of magnesium oxide (MgO), calcium oxide (CaO), strontium oxide (SrO), and barium oxide (BaO). The amount of each of these constituents added effects the crystallization of a high Q crystalline phase during sintering. This is because the glass dissolves the alumina portion of the filler ingredient and elements in the glass then combine with this alumina to subsequently allow an anorthite type phase to crystallize out of the glass. The anorthite type phase is the high Q crystalline phase (or phases) created by the chemical reaction in the final structure.

The glassy precursor material is designed so that it controls the amount of the anorthite type phase that will be formed—i.e., when the alkaline earth metal oxides or $SiO_2$ are consumed or used up to form the anorthite crystalline phase, the reaction stops. This provides the desirable benefit of precise process control. If the reaction did not stop at this point, it would be necessary to interrupt the process. Control of the microstructure would be very dependent upon the time and temperature of the sintering process yielding a very narrow process window. This would be undesirable. Thus, the MgO, CaO, SrO, and the BaO are added such that they and the $SiO_2$ react to form the crystalline anorthite type phase.

The crystallized non-glass is made up of approximately 1M MgO, or CaO or SrO, 1M $Al_2O_3$ and 2M $SiO_2$. The amount of CaO and SrO added to the glass is based upon how many moles of $SiO_2$ are present in the glassy precursor material. After the crystallization is complete, there will be no or very little alkaline earth metal oxide present in the glass, as it is all consumed in the formation of the anorthite type phase. Further, there is typically only a very small amount of $SiO_2$ left in the final glass relative to the starting composition. That is from 25 wt % to nearly 100 wt % of the $SiO_2$ is consumed in the glass-filler reaction. With all the alkaline earth metal consumed, the final glass composition consists of $SiO_2$, $B_2O_3$, and alkali earth metals. In the final glass the $SiO_2$ content ranges from 0 wt % to as high as 40 wt % with the final $SiO_2$ content being very sensitive to the relative amounts of MO and $SiO_2$ present the initial glass. When the $SiO_2$ is consumed the final glass is a borate glass. (on the order of between 2 wt % and 25 g.). Conversely, if too little MgO, CaO, SrO and/or BaO are added, the amount of crystallization will be too small leaving a large glass content that will in turn degrade the electrical Q of the sintered ceramic body. The only other reactant that could be depleted in the chemical reaction is alumina. Alumina is always added in excess because it is a high Q phase, and using alumina as the self limiting reactant would only serve to lower the Q of the fired ceramic body.

In addition to increasing the Q, the self limiting glass-filler reaction produces a repeatable composition whose coefficient of resonant frequency, ($T_f$) of which can be adjusted by the addition of a $T_f$ modifier material. For a composite of glass and alumina as the only filler, the $T_f$ of the final ceramic body is −55 ppm/° C. The $T_f$ modifer material can be chosen from one or more of the following: $TiO_2$, $CaTiO_3$, and $SrTiO_3$. The addition of a material with a positive $T_f$ that does not react with the glassy precursor material shifts the final ceramic body to a lower $T_f$. By controlling the amount of the $T_f$ modifier relative to the glass and alumina, the $T_f$ can be brought as near to zero as desired. The ability to maintain consistent $T_f$ from batch to batch requires that the reaction be self limiting and that the kinetics of the reaction allows the product to be formed in a reasonable amount of time.

A typical process for the preparation of the sintered ceramic material in accordance with the instant invention, and adapted for use in multilayered device fabrication, is presented below. The glassy precursor material having the composition described hereinabove, is sized to a particle size of between 1 and 10 micrometers (μm) and preferably to a size between 2 and 3 μm. Such sizing is typically accomplished by a milling technique such as ball-milling, though may be carried out by other techniques well known in the art such as vibratory milling. The glassy precursor material is combined with the filler material, including, for example, $Al_2O_3$ and a $T_f$ modifier. The filler material is likewise sized to a particle size of between 1 and 10 M$\mu$ and preferably between 2–3 M$\mu$.

The glassy precursor material and the filler material are mixed together with operative amounts of solvent, such as $H_2O$, methyl ethyl ketone (MEK), acetone, benzene, or toluene and combinations thereof. A dispersant and wetting agents such as ammonium salts of polymeric carboxylic acids, polyester/polyamine copolymer, fish oil, and polyoxyethylene acetate may also be included. A binder material such as latex, acryloid, cellulose acetate, polyvinyl alcohol, and polyethylene, and a plasticizer such as a low softening point latex, butyl benzyl phthalate, polyethylene glycol, or dibutyl phthalate and combinations thereof, may also be added.

Appropriate amounts of glassy precursor are mixed with the solvent and dispersant—50 to 80 wt % ceramic solid, 20 to 35 wt % solvent and 0.4 to 0.8 wt % dispersant. The systems are blended together by ball milling, vibratory action or stirring for a period of 24 to 48 hours. 2 to 6 wt % plasticizer and 3 to 18 wt % binder is added to the well mixed and dispersed slip. The mixture is mixed for from 1 to 5 hours using one of the techniques mentioned above. From 0 to 0.5 wt % surfactant is added as a wetting agent and/or bubble breaker. In general, the solvents, binders, plasticizer, dispersants, and surfactants are added to form a slip of adequate consistency for tape casting. The slip is continuously cast onto a mylar carrier that passes under a doctor blade. The tape formed has a thickness between approximately 1 and 15 millimeters. The ceramic density of the tape depends upon the slip viscosity, how well the ceramic was dispersed in the slip, the carrier speed under the doctor blade, the temperature of the platen over which the carrier moves after leaving the doctor blade, the velocity of the air passing over the cast tape, and the temperature of the air.

This invention may be better understood from a perusal of the following Examples.

EXAMPLES

Example I

A glassy precursor material composed of 50 wt % $SiO_2$, 15 wt % $B_2O_3$, 15 wt % PbO, 15 wt % CaO, 2.5 wt % $Na_2O$, and 2.5 wt % $K_2O$ was combined with an alumina filler and cast into a ceramic tape. Using the ceramic tape, fired pieces were made into two different types of fired ceramic devices the fired density of which were measured to be nearly 99% of theoretical. One sample was used to measure the K and Q of the glass-alumina dielectric composition and the other was used to measure the $T_f$.

The above mentioned glass was made using the following procedure: 200 total grams of powder was weighted out with each constituent being 100 grams of $SiO_2$, 53.3 grams of $H_3BO_3$, 51.3 grams of $Na_2CO_3$, 44.0 grams of $K_2CO_3$, 8.9 grams of $CaCO_3$, and 5 grams of PbO. The combined constituents were mixed and placed into a platinum crucible. The mixture was slowly heated past the deposition temperature of the carbonates to avoid violent gas evolution that would throw material out of the crucible. The mixture was then heated to 1100° C. and held for four hours to enhance the mixing of the components. The molten material was then poured into water thereby creating a frit. The frit was hand ground to pass through a −325 mesh, and ball milled to the final particle size of between 2.5 and 3.0 microns.

The glass-alumina tape was made by mixing 50 wt % glass and 50 wt % alumina filler into a jar. A dispersant, such as Tamol® (Rohm & Hass), an ammonium salt of a polymeric carboxylic acid was added to the mixture. Alumina milling media was added so that the media occupies about ⅓ of the jar. The combination was then dried milled for 16 hours. Next, 45 vol. % water and 17 vol % solid binder were add to the glass-aluminum powder. The slip was then mixed on a vibratory mill for 3 hours. After mixing, 0.5 wt % of a surfactant, Tergitol® (Union Carbide) which is alkyloxy-polyethylene oxyethanol, was added and mixed for 10 minutes. The slip was de-aired for 15 to 30 minutes, and passed through a sieve to remove any large agglomerations. Finally, the slip is cast onto mylar, and on a continuous casting type machine.

Samples for K and Q measurements were prepared by stacking 90 mm×90 mm wide green tape. The laminate was compacted with an isostatic press at 5000 psi for 10 minutes. The laminated tape was then fired using a binder burnout profile that increases the temperature at 50° C./hour to 500° C. with a 1 hour hold. The sintering profile consists of heating the laminated tape from 500° C. to 875° C. at a rate of 200° C./hour with a 1 hour hold at 850° C. The sintered sample was cooled at 150° C./hour to room temperature.

Before electrical measurements were made, silver electrodes were applied by painting silver paste onto each of the 90 mm×40 mm sides of the tape. The silver is fired in a tube furnace using a firing profile that reaches 600° C. The metallized sample was then diced into 8 mm×8 mm parallel plate capacitors. The capacitor was used to terminate a transmission line with the capacitor grounded on the opposite side. From an $S_{21}$ measurement the K and Q was measured to be 8.3 and 740 respectively.

The $T_f$ of the material was measured in a different way. A half-wave strip line resonator is made with capacitive coupling at both ends. Conventional connectors were soldered to the capacitor side of the strip line allow electrical connections. $S_{21}$ electrical measurements were made as a function of frequency. The frequency at the maximum in the $S_{21}$ measurement is recorded as a function of temperature. For a linear curve, $T_f$ is calculated from slope of the resonant frequency versus temperature plot and the resonant frequency at 25° C. FIG. 1 shows the plot for this sample, wherein $T_f$=−58 ppm/° C.

Example II

Example I showed the reaction of a glassy precursor plus alumina to form a ceramic body having excellent characteristics. This example shows how the $T_f$ of the glass-alumina composite is adjusted to any value between −58 ppm/° C. to +50 ppm/° C. by the addition of a modifier, in this case, $CaTiO_3$. $CaTiO_3$ has a dielectric constant of 168 and $T_f$ of 915 ppm/° C. The basic principle behind the $T_f$ adjustment is as follows: The $CaTiO_3$ does not react with the glassy precursor, nor the alumina, nor, does the $CaTiO_3$ interfere with the anorthite forming reaction between the glassy precursor and the $Al_2O_3$.

In this study, the glassy precursor is composed of 50 wt % $SiO_2$, 15 wt % $B_2O_3$, 15 wt % PbO, 15 wt % CaO, 2.5 wt % Na2O, and 2.5 wt % $K_2O$. The glassy precursor was combined in different ratios with a filler material in order to determine the effects of the $T_f$ modifier. In addition, the filler material was composed of different ratios of $Al_2O_3$ to $CaTiO_3$. The three-component mixture (glass-filler-modifier) was combined with 2 wt % polyvinyl alcohol, and 1 wt % polyethylene glycol to form a green body in the form of a quarter-wave resonator. A binder/plasticizer burn out ramped the green body from room temperature to 500° C. at 100° C. per hour. The sintering profile was a 200° C. per hour ramp from 500° C. to 850° C. with a one hour hold at 850° C. The sample was cooled at 150° C. per hour. The fired sample was coated with a low fire thick film silver paste and fired at 600° C. to form the quarter-wave resonator.

Figure 2:
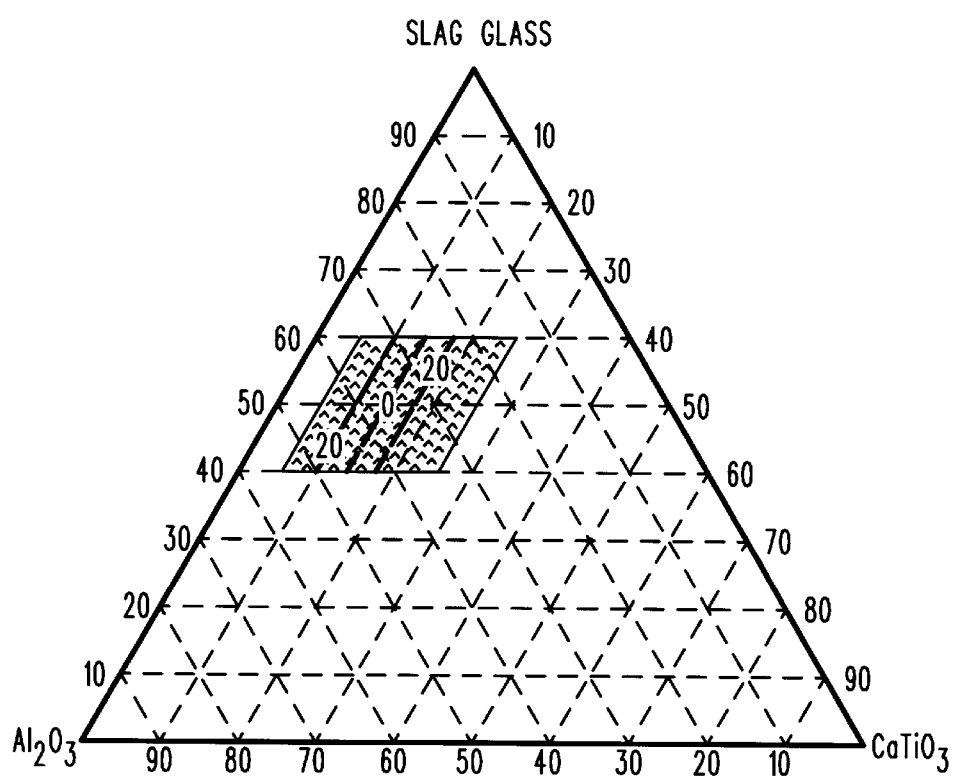
FIG. 2 is a compositional diagram for materials in accordance with the instant invention.
Figure 3:
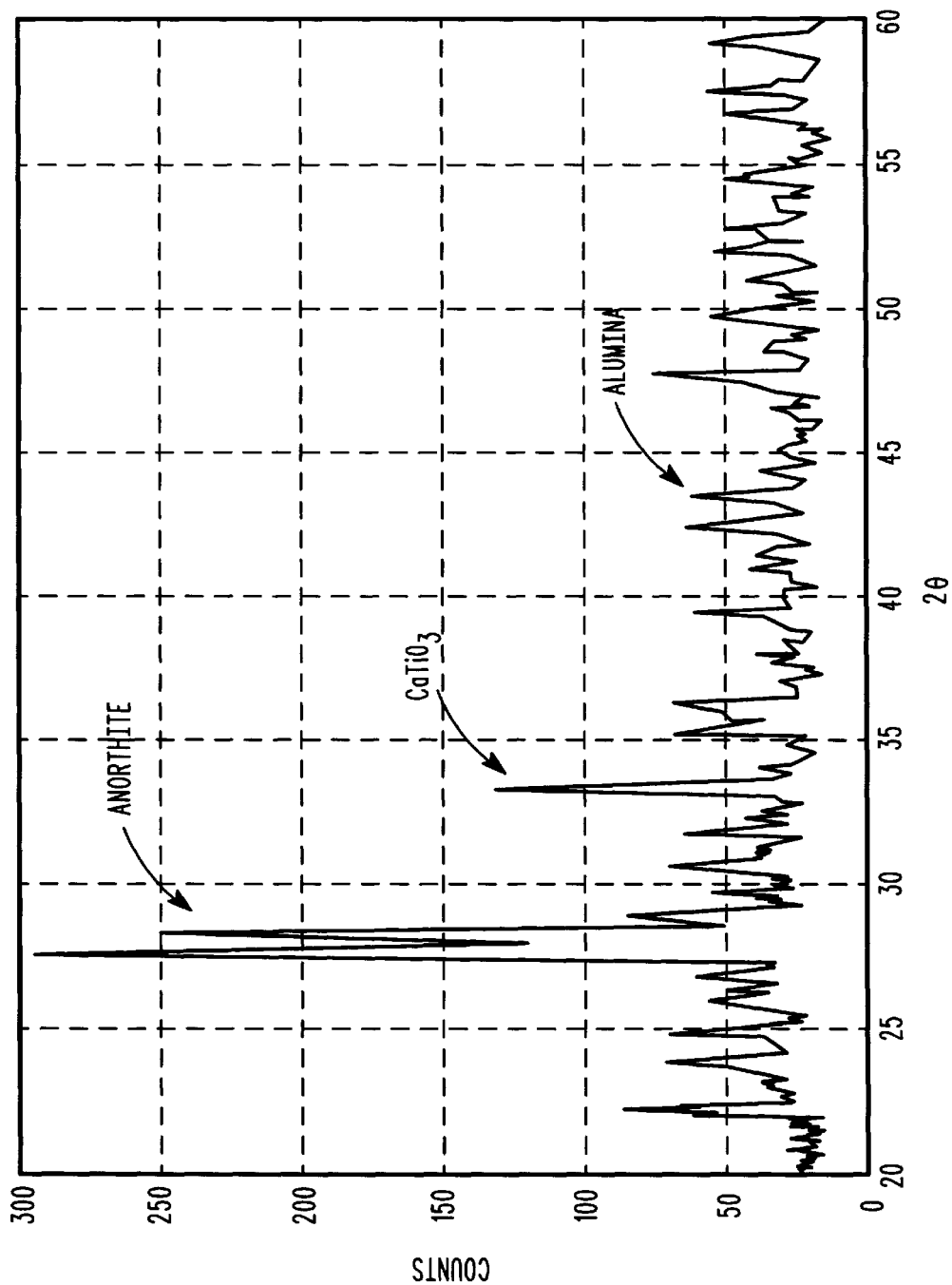
FIG. 3 is an x-ray diffraction pattern for a material in accordance with the instant invention.

Referring now to FIG. 2, there is illustrated therein a family of iso-$T_f$ lines constructed from the experimental data. Note that the iso-$T_f$ lines are straight and lie on lines of constant $CaTiO_3$ concentration. Experimentation showed that the glass and alumina have nearly the same $T_f$ (approximately −55 ppm/° C.). X-ray diffraction data illustrated on FIG. 3 demonstrates that the sintered material shows three crystalline phases: anorthite at ~27–28 degrees 2θ, alumina ~44degrees 2θ, and $CaTiO_3$. This data supports two facts regarding the adjustment of the $T_f$ using $CaTiO_3$ at about 33 degrees 2θ,. First, the iso-$T_f$ lines lie on a constant $CaTiO_3$ composition line and the x-ray data shows that the $CaTiO_3$ did not react with either the glass or alumina. Second, $CaTiO_3$ can be used to adjust the $T_f$ from −58 ppm/° C. to 50 ppm/° C.

Example III

This example shows how $SrTiO_3$, a $T_f$ modifying material, can be used to shift the $T_f$ of the glass-alumina tape from −58 ppm/° C. to 35 ppm/° C. $SrTiO_3$ has a dielectric constant (K) of 232 and $T_f$ of 1490 ppm/° C.

In this study, the glassy precursor was composed of 50 wt % $SiO_2$, 15 wt % $B_2O_3$, 15 wt % PbO, 15 wt % CaO, 2.5 wt % $Na_2O$, and 2.5 wt % $K_2O$. The glassy precursor was combined in 1:1 weight ratio with an alumina filler and a modifier to shift the $T_f$ of the composite. The mixture was composed of 40 wt % $Al_2O_3$ and 10 wt % $SrTiO_3$. The three-component mixture is combined with dispersant, binders, plasticizer, solvent, and surfactants to form a slip used to cast this dielectric composition into a ceramic green tape.

The glassy precursor-alumina-$SrTiO_3$ tape was made by mixing 50 wt % glassy precursor, 40 wt % alumina, and 10 wt % $SrTiO_3$ into a jar. A dispersant, Tamol, was added to the mixture followed by an alumina milling media so that the media occupies about ⅓ of the jar. The combination was dry milled for 16 hours. Next, 45 vol. % water and 17 vol % solid binder were added to the glass-ceramic powder. The slip was then mixed on a vibratory mill for 3 hours. After mixing, 0.5 wt % of a surfactant, Tergitol, was added and mixed for 10 minutes. The slip was de-aired for 15 to 30 minutes, and passed through a sieve to remove any large agglomerations. Finally, the slip was cast onto mylar, and on a continuous casting type machine.

Samples for K and Q measurements are prepared by stacking 20 layers of 90 mm×90 mm green tape. The laminate was compacted with an isostatic press at 5000 psi for 10 minutes. The laminated tape was fired using a binder burnout profile that increases the temperature at 50° C./hour to 500° C. with a 1 hour hold. The sintering profile consists of heating the laminated tape from 500° C. to 875° C. at a rate of 200° C./hour with a 1 hour hold at 850° C. The sintered sample was cooled at 150° C./hour to room temperature.

Before K and Q measurements were made, silver electrodes were applied by painting silver paste onto each of the 90 mm×90 mm sides of the tape. The silver was fired in a tube furnace using a firing profile that reaches 450° C. The metallized sample is diced into 8 mm×8 mm parallel plate capacitors. Capacitors were used to terminate the transmission line with the capacitor grounded one side. From a $S_{21}$ measurement, the K and Q were measured to be 8.2 and 970 respectively.

The $T_f$ of the material was measured in a different way. A half-wave strip line resonator is made with two capacitors that couple the strip line to the network analyzer. The silver was cofired with the ceramic rather than a post fire. Connectors were soldered to the capacitor side of the strip line allow electrical connections. $S_{21}$ measurements are made as a function of frequency. The maximum frequency in the $S_{21}$ measurement is recorded as a function of temperature For this tape composition, $T_f$=±35 ppm/° C. High $SrTiO_3$ additions shifted the $T_f$ to values well over +100 ppm/° C.

Example IV

The previous examples focused on how the glassy precursor and ceramic filler constituents achieved the desired electrical properties of the dielectric composition—high Q, low K, and adjustable $T_f$ of the ceramic tapes. This example focuses on the role the glassy precursor ratio to filler ratio in determining the firing temperature of the dielectric. The glass used in these experiments was 37.5 wt % $SiO_2$, 10.7 wt % $B_2O_3$, 3.5 wt % $K_2O$, and 48.3 wt % BaO.

The glass was made by mixing together, 339.3 g of $SiO_2$, 172.6 g of $H_2BO_3$, 47.1 g of $K_2O$, and 563.6 grams of BaO in a $SiO_2$ crucible. The mixture was melted at 1400° C. for 1.5 hours and quenched in water to make a glass frit. The frit was ground to a particle size of between 2.5 and 3.0 microns.

Four dielectric compositions consisting of 45, 50, 55 and 60 wt % of the above glassy precursor was mixed with $Al_2O_3$ filler material, and $TiO_2$ $T_f$ modifier. The weight percent of $TiO_2$ was fixed at 6.5 wt % for all the experiments. The alumina had a particle size of 3.5 microns, and the $TiO_2$ had a particle size of 1 micron. Ceramic green bodies were made for each composition by mixing with 2 wt % polyvinyl alcohol, and 1 wt % polyethylene glycol. The powders were uniaxially pressed into pellets with a force of 4000 lbs.

The pressed pellets for a given composition were fired at temperatures ranging from 800° C. to 950° C. The data shown in Table II illustrates the effect of using different glassy precursor to ceramic filler ratios to make a high Q dense ceramic body. For low glass content ceramic bodies, 45 wt % glassy precursor, the ceramic body did not densify. This experimental fact is reflected in the small shrinkage shown by each ceramic body even at temperatures of up to 950° C. In addition, the K and Q was in general low for the low glass content samples. Both the low K and Q are indicative of samples with larger amounts of porosity. Varying amount of water absorption into the pores of a porous ceramic can account for variation in the sample's Q.

On the other hand, samples with larger amounts of glass show three behaviors consistent with higher densities. First, the samples shrink more at every temperature. Second, in general, the higher the glassy precursor to filler ratio the greater the value for Q at a given temperature. Third, the value of K increases with glassy precursor content, indicating a reduction in porosity. In general, the glass will have a lower value of K than alumina and much smaller value of K than $TiO_2$.

Table II. Properties of glass ceramic dielectric made by firing pellets with varying amounts of glassy precursor at four different temperatures. The samples were made from 50 g batch sizes, and they were treated at 150° C./1 hr to remove water from the pores of porous materials.

TABLE II

| | | Composition (SP 2139 Glass + Al$_2$O$_3$ + TiO$_2$) | | | |
|---|---|---|---|---|---|
| Firing T | Property | Ba-45 45% Glass 48.5% Al$_2$O$_3$ 6.5% TiO$_2$ | Ba-50 50% Glass 43.5% Al$_2$O$_3$ 6.5% TiO$_2$ | Ba-55 55% Glass 38.5% Al$_2$O$_3$ 6.5% TiO$_2$ | Ba-60 60% Glass 33.5% Al$_2$O$_3$ 6.5% TiO$_2$ |
| 800° C. | Shrinkage | 3.6% | 5.2% | 7.6% | 10.7% |
| | K | 5.2 | 5.4 | 5.7 | 6.9 |
| | Q | 602 | 1163 | 1105 | 1034 |
| 850° C. | Shrinkage | 3.2% | 4.5% | 6.8% | 9.9% |
| | K | 4.8 | 5.2 | 5.6 | 6.8 |
| | Q | 864 | 1181 | 1266 | 1285 |
| 900° C. | Shrinkage | 2.5% | 4.0% | 6.0% | 8.5% |
| | K | 5.2 | 5.5 | 5.9 | 6.9 |
| | Q | 571 | 1283 | 1280 | 1327 |
| 950° C. | Shrinkage | 2.9% | 4.1% | 6.1% | 9.0% |
| | K | 5.3 | 5.7 | 6.0 | 6.8 |
| | Q | 1374 | 1069 | 1197 | 1292 |

Example V

A glassy precursor composed of 49.1 wt % SiO$_2$, 14.1 wt % B$_2$O$_3$, 4.6 wt % K$_2$O, 15.3 wt % CaO, 9.9 wt % SrO, and 7.1 wt % BaO was combined with alumina filler material and cast into a ceramic tape. Using the ceramic tape, fired pieces were made into two different types of fired ceramic devices the fired density was measured to be better than 95% of theoretical. One was used to measure the K and Q of the glass-alumina dielectric composition and the other is used to measure the T$_f$.

The above mentioned glass was made using the following procedure: A 189.1 total grams of powder was weighted out with each constituent being 70.7 grams of SiO$_2$, 36.0 grams of H$_3$BO$_3$, 9.8 grams of K$_2$CO$_3$, 39.2 grams of CaCO$_3$, 20.3 grams of SrCO$_3$, and 13.1 grams of BaCO$_3$. The combined constituents were mixed and placed into a platinum crucible. The mixture was heated to 1300° C. and held for hour hours to enhance the mixing of the components within the glass melt. The glass was poured into water, thereby creating a frit. The frit was hand ground to pass through a –325 mesh and ball milled to the final particle size of between 2.5 and 3.0 microns.

The glass-alumina tape was made by mixing 48 wt % glass with 45.5 wt % alumina, and 6.5 wt % TiO$_2$ into a milling jar. A dispersant, Tamol, was added to the mixture. Alumina milling media is added so that the media occupies about ⅓ of the jar. The combination was dried milled for 16 hours. Next, 45 vol % water and 17 vol % solid binder were added to the glass-ceramic powder. The slip were then mixed on a vibratory mill for 3 hours. After mixing, 0.5 wt % of a surfactant, Tergitol, was added and mixed for 10 minutes. The slip was de-aired for 15 to 30 minutes, and passed through a sieve to remove any large agglomerations. Finally, the slip was cast onto mylar, and on a continuous casting type machine.

Samples for K and Q measurements are prepared by tacking 20 layers of 90 mm×90 mm wide green tape. The laminate was compacted with an isostatic press at 5000 psi for 10 minutes. The laminated tape was fired using a binder burnout profile that increases the temperature at 50° C./hour to 500° C. with a 1 hour hold. The sintering profile consists of heating the laminated tape from 500° C. to 875° C. at a rate of 200° C./hour with a 1 hour hold at 850° C. The sintered sample was cooled at 150° C./hour to room temperature.

Before electrical measurement were made, silver electrodes were applied by painting silver paste onto each of the 90 mm×90 mm sides of the tape. The silver was fired in a tube furnace using a firing profile that reaches 600C. The metallized sample was diced into 8 mm×8 mm parallel plate capacitors. The capacitors are used to terminate a transmission line with the capacitor grounded on the opposite side. From an $S_{21}$ electrical measurement the K and Q is measured to be 8.7 and 1040 respectively.

Figure 4:
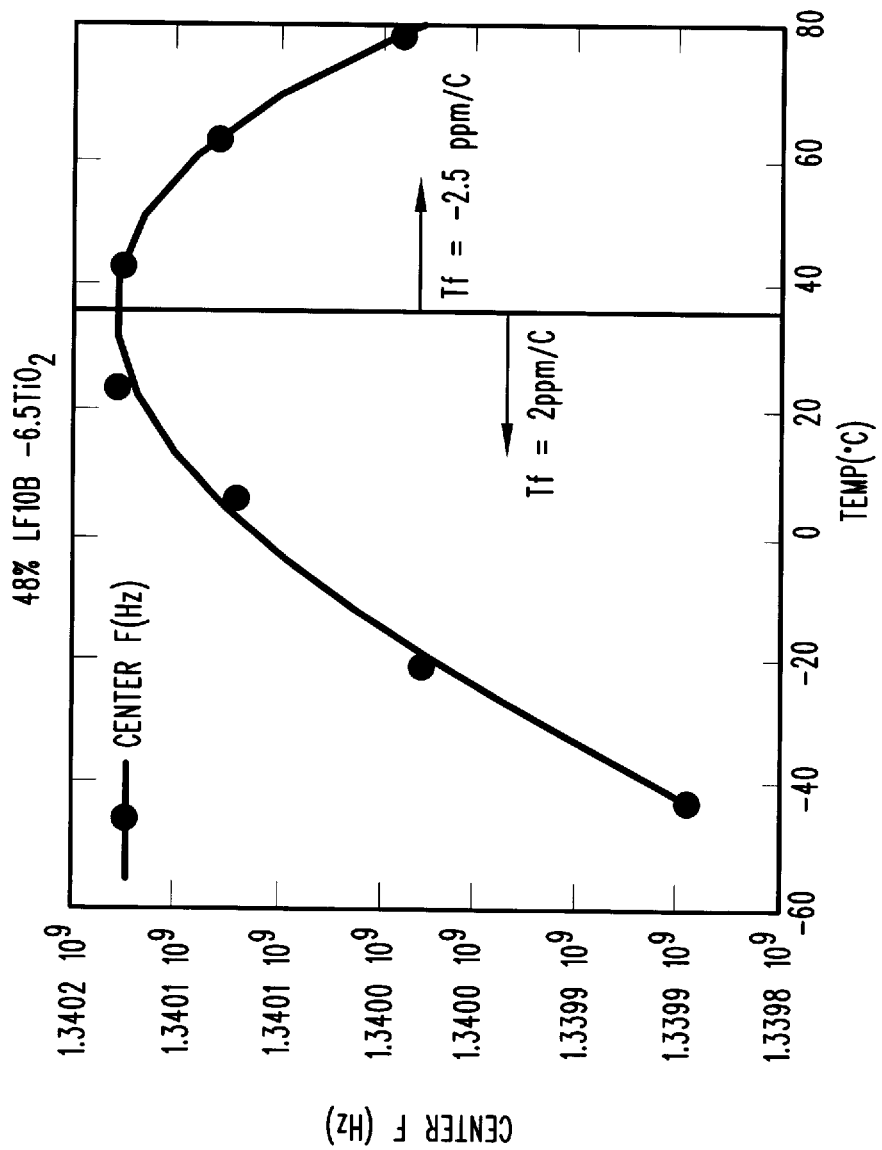
FIG. 4 is a second graph plotting resonance frequency versus temperature for a second material in accordance with the invention.

The T$_f$ of the material is measured in a different way. A half-wave strip line resonator was made with capacitive coupling at both ends. Conventional connectors were soldered to the capacitor side of the strip line allow electrical connections. $S_{21}$ measurements are made as a function of frequency. The frequency at the maximum in the $S_{21}$ measurement is recorded as a function of temperature. For a linear curve, T$_f$ is calculated from slope of the resonant frequency versus temperature plot and the resonant frequency at 25° C. In contrast, the resonant frequency of the strip line is a nonlinear function of temperature. In this case, the T$_f$ is either given by the instantaneous slope of the $f_o$ versus temperature divided by the resonant frequency at 25° C. or the T$_f$ is calculated for different portion of the graph. The nonlinear equation for the instantaneous value of T$_f$ is given by $$T_f = 2.69 - 0.057T - 0.00054T^2$$

where T is temperature in degrees Celsius and T$_f$ is in ppm/° C. In contrast, one can break the T$_f$ calculation up into regions. For temperatures less than 35° C., T$_f$ is 2.0 ppm/° C. For temperatures above 35° C., T$_f$ is –2.5 ppm/° C. Near room temperature the value of T$_f$ is near zero. This relationship is illustrated in FIG. 4.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A ceramic composition prepared by a process comprising the steps of:

providing a mixture comprising about 30–70 wt. % of a glassy precursor material comprising about 35–67 wt. % SiO$_2$, about 10–25 wt % B$_2$O$_3$, about 5–25 wt. % of at least one of MgO, CaO, SrO, and BaO and about 2–10 wt. % of at least one of K$_2$O, Na$_2$O, and Li$_2$O; and about 30–70 wt. % of a filler material comprising Al$_2$O$_3$;

providing at least one modifier selected from the group consisting of TiO$_2$, SrTiO$_3$ and CaTiO$_3$; and sintering the glassy precursor, filler and modifier at temperatures of about 875° C.;

wherein said glassy precursor said filler and said react in a self-limiting reaction such that when at least one of the said CaO, MgO, SrO, and BaO are consumed and 25 wt % to less than 100 wt % of the SiO$_2$ is consumed to form at least one high-Q alkaline-earth-metal-oxide-aluminosilicate phase; and wherein the ceramic composition comprises:
a high-Q glass phase at least one modifier selected from the group consisting of $TiO_2$, $SrTiO_3$ and $CaTiO_3$,
at least one high-Q alkaline-earth-metal-oxide-aluminosilicate phase, and
a high-Q $Al_2O_3$ phase.

2. A ceramic composition as in claim 1, wherein said ceramic composition is characterized by a dielectric constant between about 6.5 and about 10.

3. A ceramic composition as in claim 1, wherein said ceramic composition has a Q of at least about 500.

4. A ceramic composition as in claim 1, wherein said filler comprises alumina and said modifier comprises $SrTiO_3$.

5. A ceramic composition as in claim 1, wherein said ceramic composition has a coefficient of resonant frequency ($T_f$) between about +100 parts per million per ° C. and about −100 parts per million per ° C. and wherein said modifier adjusts said coefficient of resonant frequency ($T_f$).

* * * * *